(12) United States Patent
Shin et al.

(10) Patent No.: US 10,223,494 B2
(45) Date of Patent: Mar. 5, 2019

(54) SEMICONDUCTOR DEVICE MANUFACTURING METHOD AND MASK MANUFACTURING METHOD

(71) Applicant: Samsung Electronics Co., Ltd., Suwon-si (KR)

(72) Inventors: So-eun Shin, Hwaseong-si (KR); Ji-soong Park, Yongin-si (KR); Suk-ho Lee, Seoul (KR); Jung-wook Shon, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 240 days.

(21) Appl. No.: 15/219,142

(22) Filed: Jul. 25, 2016

(65) Prior Publication Data
US 2017/0024510 A1    Jan. 26, 2017

(30) Foreign Application Priority Data
Jul. 23, 2015   (KR) .......................... 10-2015-0104358

(51) Int. Cl.
*G06F 17/50*    (2006.01)
*G03F 7/20*     (2006.01)
*G03F 1/36*     (2012.01)

(52) U.S. Cl.
CPC ............ *G06F 17/5081* (2013.01); *G03F 1/36* (2013.01); *G03F 7/705* (2013.01)

(58) Field of Classification Search
CPC .......... G06F 17/5081; G03F 1/36; G03F 1/72; G03F 1/76; G03F 7/70441; G03F 7/705; G03F 1/70

USPC ..................................................... 716/52–53
See application file for complete search history.

(56) References Cited

U.S. PATENT DOCUMENTS

| | | |
|---|---|---|
| 7,587,704 B2 | 9/2009 | Ye et al. |
| 7,617,477 B2 | 11/2009 | Ye et al. |
| 7,945,871 B2 | 5/2011 | Cobb et al. |
| 8,612,901 B2 | 12/2013 | Fujimura |
| 8,826,196 B2 | 9/2014 | Sahouria |
| 2009/0031262 A1 | 1/2009 | Maeda et al. |

(Continued)

FOREIGN PATENT DOCUMENTS

| | | |
|---|---|---|
| KR | 10-2010-0066650 | 6/2010 |
| KR | 10-09821350 | 9/2010 |

OTHER PUBLICATIONS

Lin et al., "Model Based Mask Process Correction and Verification for Advanced Process Nodes." Optical Microlithography XXII, Proc. of SPIE vol. 7274, 2009.

(Continued)

*Primary Examiner* — Paul Dinh
(74) *Attorney, Agent, or Firm* — Muir Patent Law, PLLC

(57) ABSTRACT

A method of manufacture comprises a mask process correction (MPC) and verifying MPC accuracy. MPC may be performed on mask tape-out (MTO) data describing a mask pattern to obtain mask process corrected data. MPC may be performed to address a deviation between the MTO data and a mask to be manufactured. Verification of the MPC may be performed by generating a two-dimensional (2D) contour of mask pattern elements based on the mask process corrected data. When MPC has been verified, the mask process corrected data may be used to manufacture a mask and a semiconductor device.

20 Claims, 14 Drawing Sheets

(56) References Cited

U.S. PATENT DOCUMENTS

| | | |
|---|---|---|
| 2012/0128228 A1 | 5/2012 | Fujimura et al. |
| 2013/0268901 A1* | 10/2013 | Lu .............................. G03F 1/36 716/52 |
| 2013/0311958 A1 | 11/2013 | Liu |
| 2015/0012896 A1 | 1/2015 | Ltaypov et al. |
| 2015/0362834 A1* | 12/2015 | Choi ......................... G03F 1/78 716/53 |
| 2017/0004233 A1* | 1/2017 | Han .......................... G03F 1/36 |

OTHER PUBLICATIONS

Fujimura, Aki, "Mask Hosspots Are Escaping the Mask Shop; Model-Based Maks Verification Can Stop Them." Managing Company Sponsor of the eBeam Initiative.

* cited by examiner

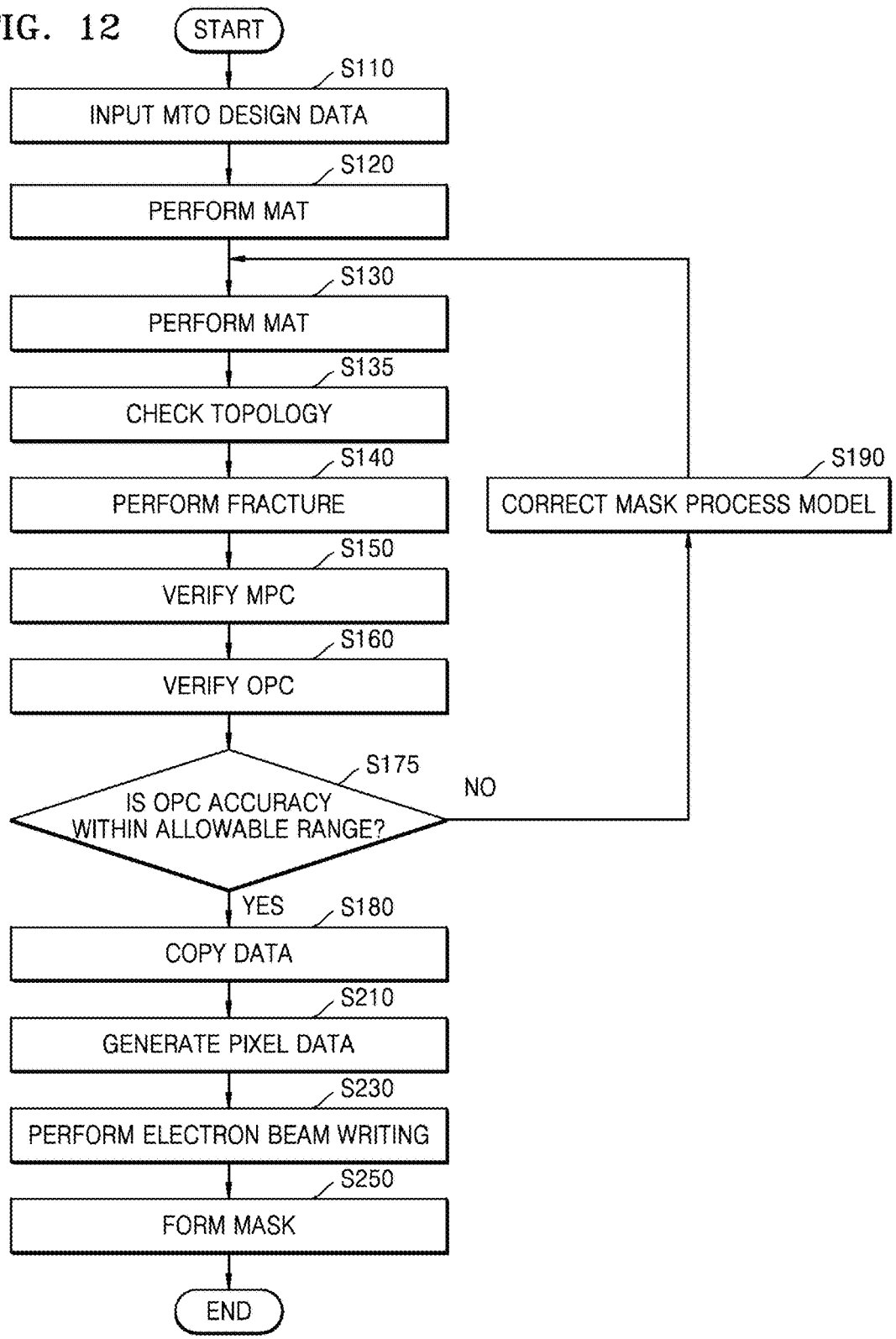

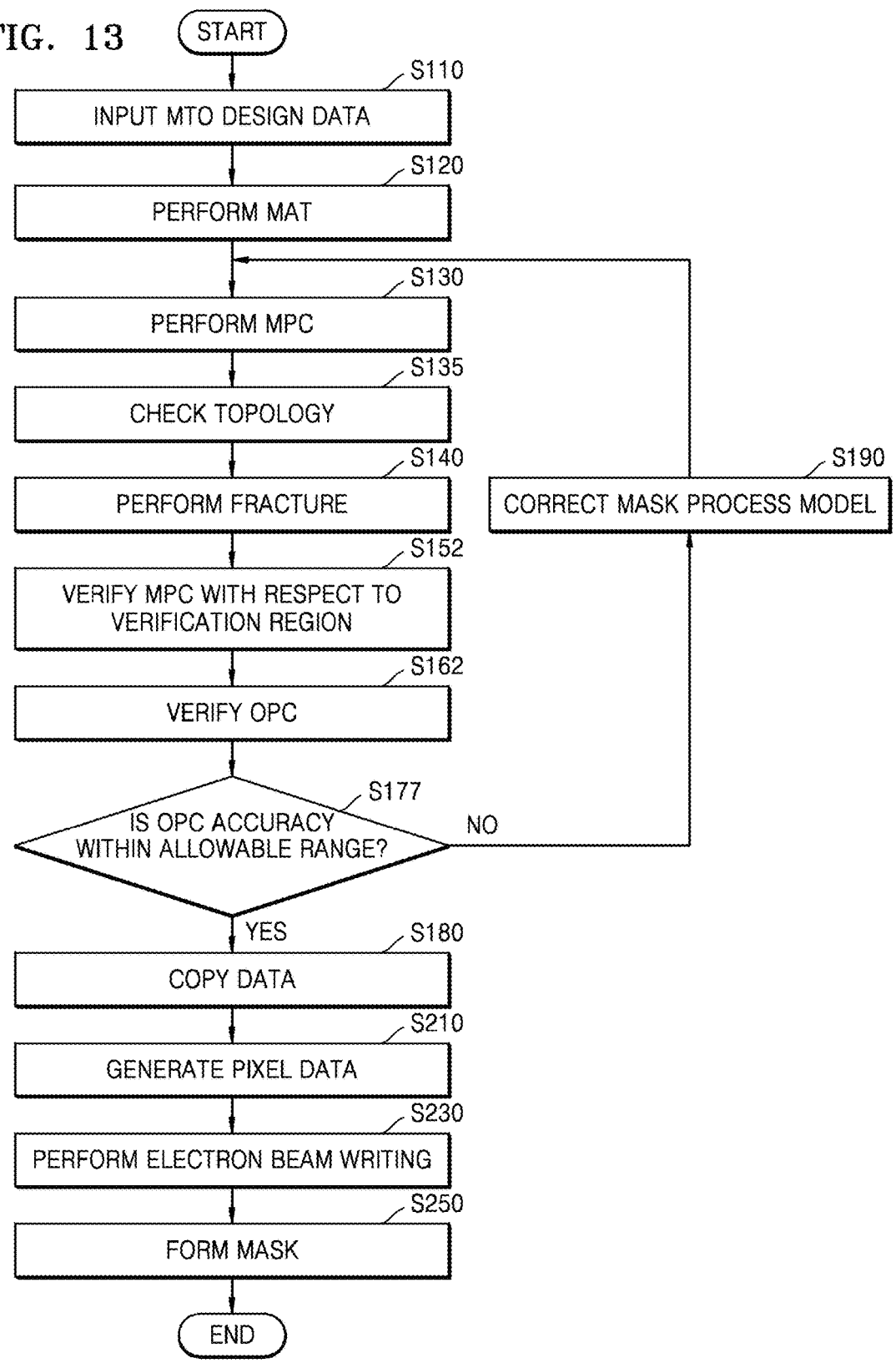

SEMICONDUCTOR DEVICE MANUFACTURING METHOD AND MASK MANUFACTURING METHOD

CROSS-REFERENCE TO RELATED APPLICATION

This application claims the benefit of Korean Patent Application No. 10-2015-0104358, filed on Jul. 23, 2015, in the Korean Intellectual Property Office, the disclosure of which is incorporated herein in its entirety by reference.

BACKGROUND

The disclosure herein relates to a semiconductor manufacturing processing, a mask manufacturing method, and a mask manufacturing method including a mask process correction (MPC) verifying method. Unless context indicates differently, masks described herein refer to photolithography masks (which are also known as photomasks, photoreticles or simply as reticles).

In manufacturing a semiconductor device, a lithography process is typically an essential process for forming a circuit pattern by irradiating light on a photosensitive film coated on a substrate. As line widths are reduced, use of an extreme ultraviolet (EUV) light source and an electron beam source are being explored as a new generation of light sources. As patterns on a semiconductor device are miniaturized, an optical proximity effect (OPE) is caused by an influence between adjacent patterns. In order to overcome the OPE, optical proximity correction (OPC) and mask process correction (MPC) are used to create a mask which may be used to manufacture semiconductor devices. The OPC may suppress the occurrence of the OPE by correcting a pattern layout on a mask, and the MPC is a method of correcting data about a large number of systematic errors occurring during a process of transferring mask tape-out (MTO) design data as an image on a wafer after the OPC.

SUMMARY

The inventive concept provides a mask process correction (MPC) verifying method capable of verifying MPC accuracy and a mask manufacturing method including the MPC verifying method.

A manufacturing method may comprise performing a mask process correction (MPC) on first mask tape-out (MTO) design data describing a first mask pattern by applying a mask process correction to the first MTO design data to obtain second MTO design data describing a second mask pattern; verifying the performance of the MPC by generating a two-dimensional (2D) contour of one or more mask pattern elements by performing a simulation of manufacturing corresponding one or more mask pattern elements described by the second MTO design data using a mask process model; and manufacturing at least one of a mask and a semiconductor device in response to the verifying.

A manufacturing method may comprise performing mask process correction (MPC) on first mask tape-out (MTO) design data describing a first mask pattern by using a mask process correction model describing a first mask pattern to obtain second MTO design data describing a second mask pattern, the MPC addressing a deviation of mask pattern elements of the first mask pattern and mask pattern elements of a mask to be manufactured; performing verification of the MPC by generating a two-dimensional (2D) contour of one or more mask pattern elements of the second mask pattern using a mask process model; generating pixel data based on the second MTO design data; performing electron beam writing on a mask blank based on the pixel data; and forming a mask by performing a development process and an etching process on the mask substrate.

A method of manufacturing may comprise providing a first mask tape out (MTO) design data representing a first mask pattern having a plurality of first mask pattern elements; using a mask process correction, modifying the first MTO to obtain second MTO design data representing a second mask pattern having a plurality of second mask pattern elements, each of the second mask pattern elements corresponding to a respective one of first mask pattern element, at least some of the second mask pattern elements having a different size than the corresponding first mask pattern element; using a mask process model, simulating a manufacture of one or more of one or more of the second mask pattern elements to obtain first contours respectively corresponding to the one or more second mask pattern element; determining a plurality of first deviation values, by, for each first contour, comparing the first contour to a corresponding first mask pattern element, to obtain a first deviation value for each first contour; based on the plurality of first deviation values, determining that the mask process correction is insufficient; adjusting the mask process model; adjusting the mask process correction based on the adjusted mask process model; using the adjusted mask process correction, modifying the first MTO to obtain third MTO design data representing a third mask pattern having a plurality of third mask pattern elements, each of the third mask pattern elements corresponding to a respective one of first mask pattern element, at least some of the third mask pattern elements having a different size than the corresponding first mask pattern element; using the adjusted mask process model, simulating a manufacture of one or more of the third mask pattern elements to obtain corresponding second contours respectively corresponding to the one or more third mask pattern elements; determining a plurality of second deviation values, by, for each second contour, comparing the second contour to a corresponding first mask pattern element, to obtain a second deviation value for each second contour; based on the plurality of second deviation values, determining that the mask process correction is sufficient; and manufacturing at least one of a mask and a semiconductor device using the third MTO design data.

BRIEF DESCRIPTION OF THE DRAWINGS

Exemplary embodiments of the inventive concept will be more clearly understood from the following detailed description taken in conjunction with the accompanying drawings in which:

FIGS. 11 to 13 are flowcharts of manufacturing methods.

DETAILED DESCRIPTION OF THE EMBODIMENTS

Figure 1:
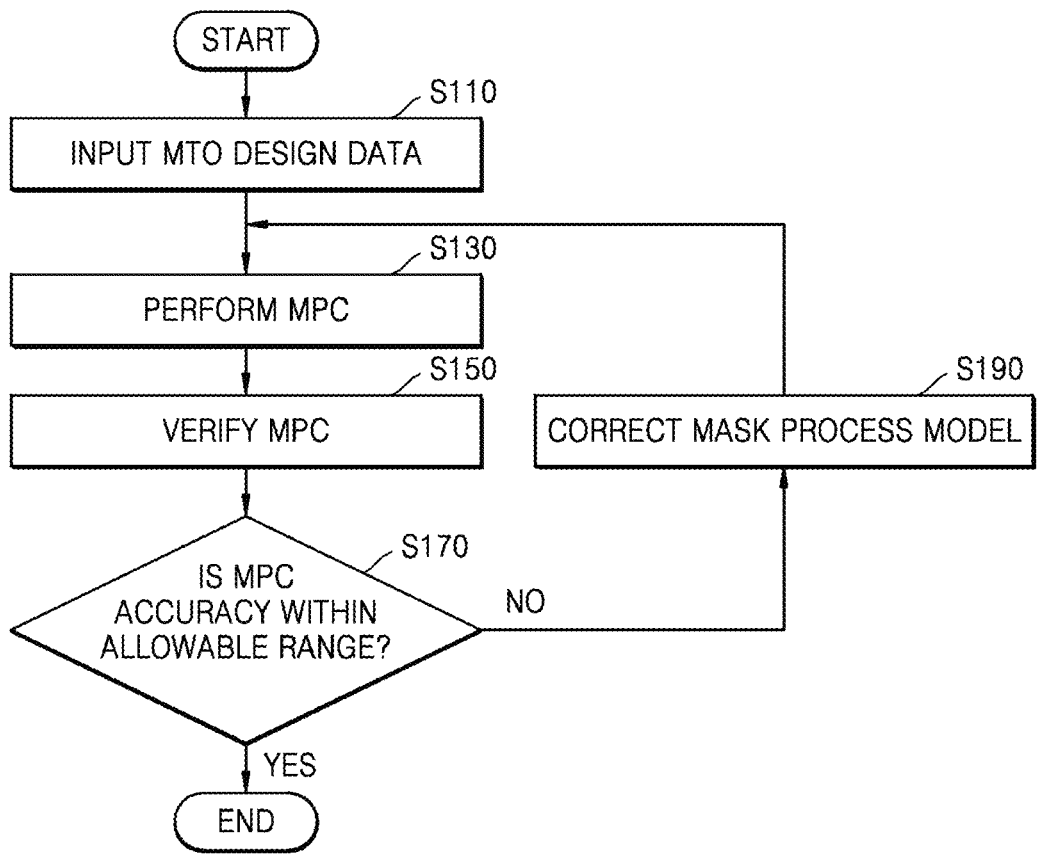
FIG. 1 is a flowchart of a mask process correction (MPC) verifying method according to an exemplary embodiment.

FIG. 1 is a flowchart of a mask process correction (MPC) verifying method according to an exemplary embodiment of the inventive concept.

Referring to FIG. 1, in the MPC verifying method according to the present exemplary embodiment, mask tape-out (MTO) design data is received (S110). The MTO design data in this example includes optical proximity correction (OPC) design data to create OPC mask features. The MTO design data may be mask design data after OPC feature placement in the mask design has been completed. The MTO design data may have a graphic data format used in electronic design automation (EDA) software or the like. For example, the MTO design data may have a data format such as Graphic Data System II (GDS2) or Open Artwork System Interchange Standard (OASIS). The MTO design data may describe the desired mask pattern of a mask to be manufactured. For example, the MTO design data may describe the desired size, shape and locations of pattern elements, such as openings, attenuation features, phase shift features, etc. of the mask to be manufactured.

As patterns are miniaturized, an optical proximity effect (OPE) may be caused by the influence between adjacent patterns on the mask during an exposure process. In order to overcome the OPE, OPC technology is used for suppressing the occurrence of the OPE by providing OPC pattern elements to a pattern layout on a mask that transfers a pattern to a wafer in the manufacturing of a semiconductor device (e.g., by selectively exposing a photoresist film to radiation, such as light such as EUV, etching the photoresist to pattern the photoresist, and etching a layer under the photoresist using the patterned photoresist). Often, the OPC pattern elements of a mask pattern are not transferred to the pattern transferred to the wafer but rather act to increase or decrease intensity of light transmitted by other pattern element through constructive or destructive interference. The OPC technology may be categorized into two technologies, i.e., a rule-based OPC and a simulation-based or model-based OPC.

In the rule-based OPC, a test mask pattern may be manufactured, and a test wafer may be manufactured by transferring the test mask pattern onto a wafer (e.g., using the test mask pattern on a mask to pattern a layer on the wafer using photolithography). A design rule may be determined for determining bias data applied to design data of a mask pattern based on design data of the test mask and measurement data about a pattern formed on the wafer. When the design rule is determined, the mask pattern may be corrected based on the design rule. The correcting of the mask pattern may be performed in a layout computer-aided design (CAD) process of the mask pattern. Since it is necessary to measure a test pattern with respect to all of patterns allowable on a design and repeat an operation whenever a process is changed, the rule-based OPC may be costly and time-consuming.

In the model-based OPC, kernels (e.g., model elements) may be generated that model the pattern transfer process from small portions of the mask to the wafer, taking into consideration the OPE that may be generated. The kernels (model elements) may be generated based on measurement results of a small amount of prepared test patterns on a wafer, that is, representative patterns. The measurement results may be used to determine a difference between a shape of the mask pattern and a shape of the pattern transferred onto the test wafer. The measurement results may be used to generate the kernels which may allow simulation of the resulting wafer pattern to be generated from a designed mask pattern, and thus the mask pattern may be corrected according to a result of the simulation. Since the model-based OPC does not need to measure a large amount of test patterns, the model-based OPC may reduce time and costs, but may not be sufficiently accurate, and fail to reflect influences due to density of a pattern, shapes of adjacent patterns, or distances between the adjacent patterns.

After the MTO design data is received, MPC may be performed (S130). During manufacturing of a mask based on the MTO design data, the MPC may address, using a mask process model, a difference between the designed mask pattern and the pattern obtained on the manufactured mask that results from mask process deviations during the manufacturing of the mask. The MPC may more broadly mean a process of manufacturing a mask (which may be as of manufacturing a semiconductor device) and correcting data to address a number of systematic deviations or errors that may occur with respect to differences between the desired pattern described by the MTO data and the actual mask pattern created in manufacturing the mask. For example, the systematic errors may be caused by distortions resulting from a process of manufacturing a mask, such as an electron beam writing process, a development process, an etching process, and a bake process.

In mask data preparation (MDP), the MPC may be performed by adjusting mask MTO design data using a mask process correction function. The mask process correction function may be or act as a transformation function to modify a mask pattern element in response to the mask pattern element as well as surrounding mask pattern elements in view of these mask pattern elements size, shape and/or spacings. The mask process correction function may be rule based embodied by software that adjusts the mask MTO design data based on a set of rules. The adjusting of the mask MTO design data by the mask process correction function may include adjusting a pattern element size, such as a line width, and adjusting a degree of precision of pattern placement. The mask process correction function may be applied to the MTO design data to adjust one or more of the size, shape, location, edge location and/or corresponding electron beam dosage (or beam energy intensity) of the pattern elements of the mask as reflected in the MTO design data. That is, the mask process correction function may be applied to first data (the MTO design data) to obtain second data that describes a modified mask pattern (and modified mask pattern elements). The modified mask pattern (as well as the modified mask pattern elements) may have a different size, shape, location and/or edge locations from the actual mask pattern (desired mask pattern elements) that is/are desired to be obtained after manufacturing the mask. The second data may include data and/or instructions to control an electron beam exposure system and need not describe a modified shape of a mask pattern element (although it a modified shape of a mask pattern might result from such second data upon operation of the electron beam exposure system using such second data). The second data may be a MEBES (manufacturing electron beam exposure system) file to control the operation of the electron beam exposure system or may be an OASIS file from which a MEBES file is later generated. The desired mask pattern and desired mask pattern elements may be described by the MTO design data. The second data may be represented using the same graphic data format as the MTO design data.

The second data obtained by MPC may be or may result in MEBES data may be used to generate the "recipe" to manufacture the mask. The MEBES data may instruct the manufacturing equipment to generate a mask (which may have a modified mask pattern and modified pattern elements). For example, the second data may be or be used to generate MEBES instructions (e.g., software code) to control the electron beam in the electron beam writing process to write a pattern on a resist layer of a mask blank, where locations, shapes, edge locations and/or sizes of pattern elements may be different from that described by the MTO design data or, they may be the same with a first set of mask process variables (e.g., electron beam intensity or dosage) assigned thereto. A mask blank may comprise a glass substrate, an absorber layer (such as chromium), an anti-reflective layer (ARC) and a resist film stacked in that order. In addition, the MPC may function to supplement the OPC. For example, in a case where a peripheral pattern density is high, when a CD error still occurs even though the OPC data has been provided with the MTO design data, the CD error may be addressed through the MPC. When a pattern density is low, or a pattern size is large, the MPC may be omitted. Recently, as a pattern size has been miniaturized, and patterns have become denser, the MPC has become an important element in the mask manufacturing and semiconductor manufacturing process. However, MPC often consumes a relatively large amount of time.

After MPC is performed in step S130, MPC verification may be performed (S150). The MPC verification may verify whether the MPC in step S130 is provides sufficiently accurate results. For example, the MPC verification may verify whether correction by the mask process model used in the MPC is accurate. Formerly, only a rough confirmation could be performed as to whether a missing portion or excessive correction of a pattern existed, by performing an XOR calculation on mask data before and after the MPC was performed, and MPC accuracy could not be confirmed in detail.

In the MPC verification according to the present exemplary embodiment, the MPC accuracy may be verified by simulating the manufacturing of the mask when manufactured using the second data (referred to herein as "mask process corrected data" or "MPC data") to obtain a two-dimensional (2D) contour of the mask pattern by using a mask process model and by comparing the 2D contour with the desired corresponding pattern as described by the MTO design data before the MPC is performed. The shaping of the mask pattern into the 2D contour may be performed by performing a simulation of the manufacturing process of the mask using the mask process model when manufacturing a mask having a pattern described by the second data. Obtaining the 2D contour and the comparison of the 2D contour with the corresponding pattern described by the MTO design data will be described in more detail with reference to FIG. 2.

Figure 11:
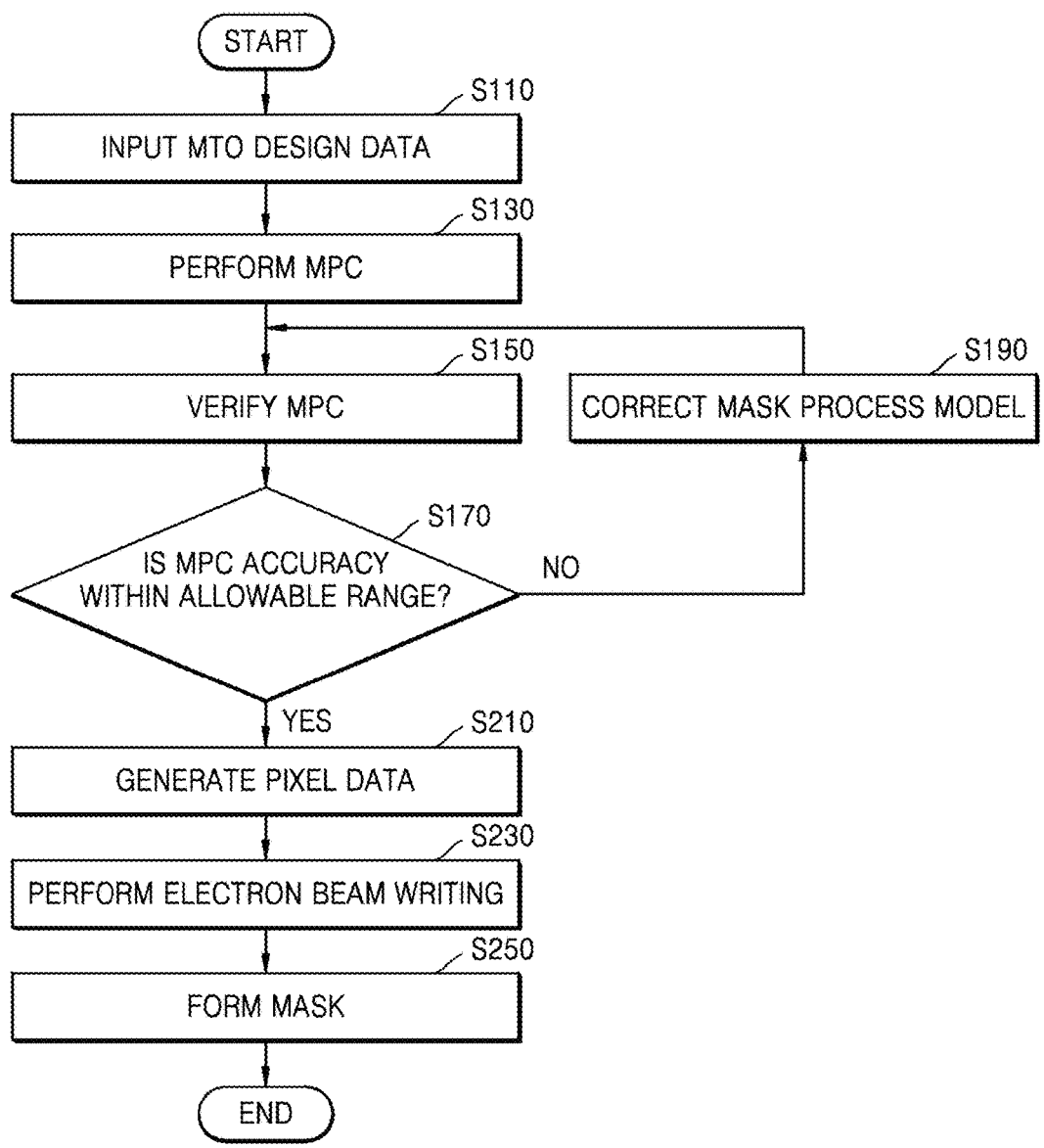

After the MPC verification is performed, it may be determined whether the MPC accuracy (e.g., as reflected by the mask process correction function) is within an allowable range (S170), and when it is determined that the MPC accuracy is within the allowable range (YES), the MPC verifying method is ended. After the MPC verifying method is ended, as illustrated in FIG. 11, a mask may be manufactured using the second data. When the MPC accuracy deviates from the allowable range, the mask process model may be corrected (S190). The correcting of the mask process model may be performed by changing recipe data of the mask process model based on a result of the above-described comparing in attempt to solve the difference. The recipe data of the mask process model may include process parameters used to control the manufacturing equipment to manufacture a mask (e.g., electron beam intensity, pattern beam dosage, bias voltages and time for dry etching, temperatures and time for curing photoresist, etc.) The changed mask process model may be used to derive a corrected mask process correction function to be used in the subsequent MPC (step S130). Alternatively or in addition, the mask process correction function may have certain parameters changed without reference to a modified mask process model that results in different "second data" or different mask process corrected data (which may be referred to herein as "third data") when the changed mask process correction function is applied to the MTO design data. These parameters that are changed may be weightings used to determine what should be adjusted and/or how much adjustment should be made to various pattern elements of the mask (or the mask process parameters described herein associated with the various pattern elements) described by the MTO design data.

After the mask process model is corrected in step S190, operation S130 of performing the MPC and operation S150 of verifying the MPC may be performed again using the corrected mask process model. Operation S190 of correcting the mask process model, operation S130 of performing the MPC, and operation S150 of performing the MPC verification may be repeated using the latest corrected mask process model until the MPC accuracy enters the allowable range.

In the MPC verifying method according to the present exemplary embodiment, the MPC accuracy may be precisely verified obtaining the 2D contour via manufacturing simulation using the mask process model and by comparing the 2D contour with the shape represented by the MTO design data. On the basis of the MPC verification, when the MPC accuracy deviates from the allowable range, the mask process model may be corrected, and the MPC and the MPC verification may be repeated, thereby obtaining an improved mask process correction function. In addition, the MPC may be performed using an improved mask process correction function that is obtained by modifying the recipe of the mask process model, thereby not only improving the MPC accuracy but also contributing to the use of a more precise mask manufacturing recipe to improve the mask manufacturing process.

Figure 2:
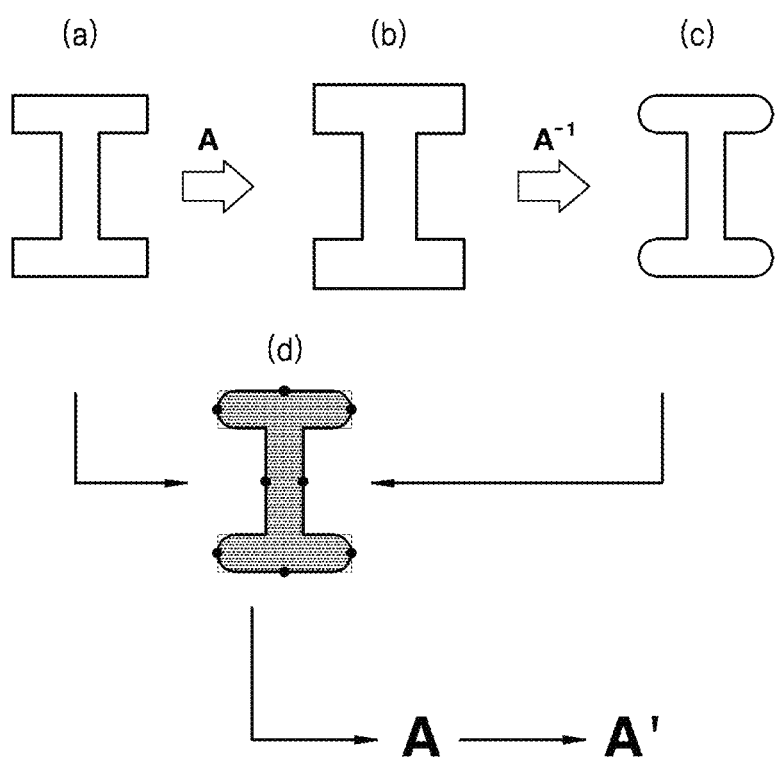
FIG. 2 is a conceptual diagram for describing a principle of the MPC verifying method of FIG. 1.

FIG. 2 is a conceptual diagram for describing a principle of the MPC verifying method of FIG. 1.

(a) of FIG. 2 illustrates the shape of a mask pattern element represented by the MTO design data (for ease of description, a shape of a mask pattern element, such as (a) of FIG. 2, will be referred to herein as an "MTO shape"). The MTO shape may be represented, for example, by a 2D function $\Psi_0$ ($x_0$, $y_0$). (b) of FIG. 2 illustrates a shape obtained by applying a mask process correction function A to the MTO design data (for ease of description, a shape of a mask pattern element, such as (b) of FIG. 2 will be referred to herein as a "mask process corrected shape" or "MPC shape"). The mask process corrected shape may correspond to a shape of a mask pattern element represented by or used to derive recipe parameters/instructions to manufacture a mask with the mask pattern element.

(c) of FIG. 2 illustrates a shape of a mask pattern element output in a 2D contour form by simulating manufacturing of a mask using the mask process corrected data obtained by MPC using the mask process correction function (for ease of description, a shape of a mask pattern element obtained through simulation of manufacturing a mask, such as (c) of FIG. 2, will be referred to as a "2D contour"). The simulation of manufacturing a mask to obtain the 2D contour may use the mask process model. The simulation is represented by $A^{-1}$ in FIG. 2 which may be a simulation transformation function applied to the mask process corrected data and/or the shape represented by the mask process corrected data. The simulation transformation function $A^{-1}$ roughly correlates to an inverse of the mask process correction transformation function A and is represented in FIG. 2 as $A^{-1}$. It will be recognized that the simulation transformation function is not precisely the inverse function of the mask process correction transformation function as otherwise, the shapes in (a) and (c) of FIG. 2 would be the same. Data representing a 2D contour in (c) may be expressed by a 2D function $\Psi(x, y)$, similar to the shape represented by the MTO design data described above. The 2D functions describing the MTO shape and the 2D contour (respectively $\Psi_0(x_0, y_0)$ and $\Psi(x, y)$) need not be in the same graphic data. For example, the 2D function $\Psi_0(x_0, y_0)$ describing the MTO shape may be derived from MTO design data. The 2D function $\Psi(x, y)$ may be derived from a manufacturing simulation (such as applying a simulation transformation function $A^{-1}$) to a 2D function $\Psi_m(x_m, y_m)$ that was derived from the mask process corrected data.

After the 2D contour is output, (d) of FIG. 2 illustrates that the 2D contour obtained via simulation is compared with the shape represented by the MTO design data. The comparing may be performed on all of positions of a pattern or may be performed only on certain designated positions of the pattern. For example, in (d) of FIG. 2, the comparing may be performed only on positions indicated by black points.

When a difference between the shape obtained by the MTO design data and the 2D contour is determined to be within an allowable range through the comparing, the MPC verification may be ended. In other words, it may be considered that MPC accuracy is confirmed within a predetermined degree (and may indicate that the pattern elements of the mask to be manufacture will not deviate from the corresponding pattern elements represented by the MTO design data by more than a predetermined threshold or predetermined degree).

However, when the difference between the shape obtained by the MTO design data and the 2D contour is determined to be outside the allowable range, the mask process model may be adjusted from which make a new mask process correction function may be derived. The new mask process correction function may be generated using a new mask process model that reflects an altered manufacturing recipe and which is used in the subsequent mask manufacturing simulation in view of the new, mask process corrected data obtained from the new mask process correction function being applied to the MTO design data. The MPC, the outputting of the 2D contour, and the comparing may be repeated until the MPC accuracy is confirmed to be within a predetermined degree. The mask process model and the mask process correction function A may continue to be adjusted such that a value of $\Sigma [\Psi_0(x_0, y_0)-\Psi(x, y)]^2$ is minimized (or made smaller than an acceptable threshold value) with respect to these 2D functions described herein.

Although not illustrated, in the MPC verifying method according to the present exemplary embodiment, verification may also be performed at a wafer level by performing the OPC verification through a lithography simulation that uses a mask having the 2D contour as input data to the lithography simulation (e.g., using wafer level 2D pattern elements contour shapes obtained by simulating a lithography process using the mask pattern obtained by simulation using the mask process model). An exemplary OPC verification will be described in more detail with reference to FIG. 5.

Figure 3:
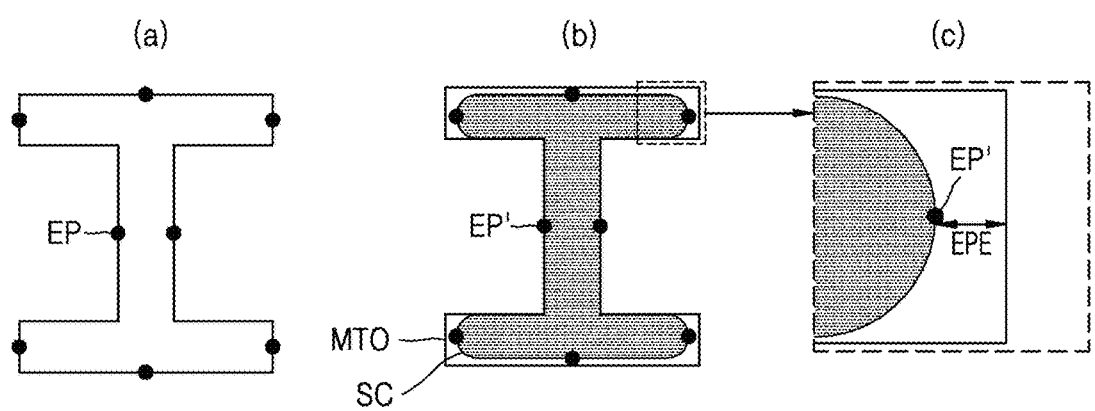
FIG. 3 is a conceptual diagram for describing a process of comparing a two-dimensional (2D) contour with a shape obtained by MTO design data and a concept of an edge placement error (EPE) in FIG. 2.

FIG. 3 is a conceptual diagram for describing a concept of an edge placement error (EPE) and a process of comparing a 2D contour SC with a shape represented by the MTO design data of FIG. 2. For ease of description, the shape represented by the MTO design data will be referred to as an "MTO shape," the shape represented by the mask process corrected data will be referred to as "an mask process corrected shape" and the shape obtained by simulation using the mask process model as described herein will be referred to as a "2D contour SC" or "SC."

As described with reference to FIG. 2, the shape represented by the MTO design data is illustrated in (a) of FIG. 3. In order to compare the 2D contour acquired through the simulation with the shape represented by the MTO design data, evaluation points (EPs) may be preset on the shape represented by the MTO design data. The EPs are illustrated in (a) of FIG. 3 as being respectively preset at centers of lines constituting edges of the pattern. For example, the EPs may be set at appropriate positions of the pattern, such as at the extremities of the pattern edges and at midpoints of pattern edges, based on various references such that the verification is easily performed. The EPs are set at the same relative locations for each of the MTO shape and SC shape so that each EP of the MTO shape corresponds to an EP of the SC. For ease of description, an EP of the MTO shape and a corresponding EP of the SC shape may be referred to herein as an EP pair.

(b) of FIG. 3 illustrates that the 2D contour SC shape is compared with the MTO shape represented by the MTO design data. For example, as illustrated in (b) of FIG. 3, the 2D contour SC shape may have edges that smoothly connect to each other at curved corners, but the shape MTO obtained by the MTO design data may have edges that connect at a right angle. In (b) of FIG. 3, in order to distinguish the 2D contour SC shape and the MTO shape represented by the MTO design data, an inside of the 2D contour SC is shaded.

The EP's are shown on the 2D contour SC are acquired through the simulation, and it may be confirmed that positions of some of the EP's on the 2D contour SC are slightly different from initial positions of the corresponding EPs on the MTO shape corresponding to the MTO design data.

(c) of FIG. 3 is an enlarged diagram of a dashed rectangular portion of (b) of FIG. 3. MPC verification may include a verification using an edge position error EPE. The EPE may be defined and calculated as a difference between corresponding edge positions of the 2D contour SC and the MTO shape (representing a target shape of a mask pattern element) obtained via the MTO design data. Therefore, the MPC verification may be performed by calculating EPE values for each of the EP pairs of the patterns to determine an error. For reference, the manufacturing simulation to obtain the 2D contour SC may be performed with respect to edge points EP of the MTO shape to determine locations of corresponding edge points on the 2D contour (the full 2D contour SC may be considered to be a connection (e.g., interpolation) of these corresponding edge points EP of the contour SC determined via simulation). Thus, the EPE values may be acquired through a simulation calculation at each edge point EP of the MTO shape to obtain the corresponding edge points EP of the 2D contour SC and the full 2D contour need not be extracted. Therefore, issue occurrence points may be predicted according to the EPE values, and the extracting of the 2D contour may be limited such that the 2D contour is extracted and simulation is performed only with respect to relevant EP points of the MTO shape.

Although not illustrated, the MPC verification may include calculating a difference of corresponding line widths of the pattern elements, which may be a comparison of critical dimensions (CD) of the patterns. In addition, the MPC verification may include calculating the CD difference and the EPE together. For example, in the MPC verifying method according to the present exemplary embodiment, the verification may be performed by quantifying an error amount before/after the MPC into the CD and EPE. It may be necessary to select the appropriate EPs for quantifying the error amount. The quantifying of the error amount will be described in more detail with reference to FIGS. 7A and 7B.

In addition, due to special characteristics of a mask data processing process dealing with a 4*design, when an error amount of a full chip level is calculated, much time may be spent. Therefore, the 2D contour may be output only with respect mask pattern elements at regions having a specific error amount or more. For example, as described above, the 2D contour may be output only with respect to points in which the EPE values exceed a set value. In addition, simulation and verification calculations described herein need not be performed not every mask pattern element within a region having a specific error amount or more. Rather, simulation and verification calculations for only a selected subset of distributed mask pattern elements may be performed so as to reduce a calculation of the error amount of the full chip level/full mask.

Figure 4A:
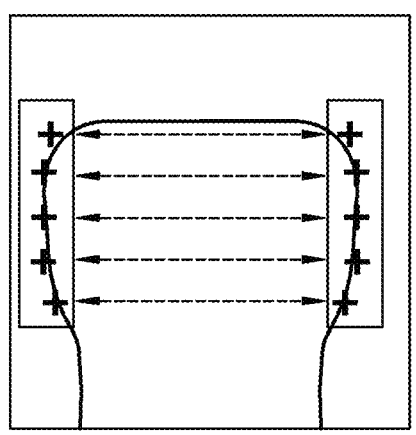
FIGS. 4A and 4B are conceptual diagrams for describing a critical dimension (CD) measurement and a contour measurement.
Figure 4B:
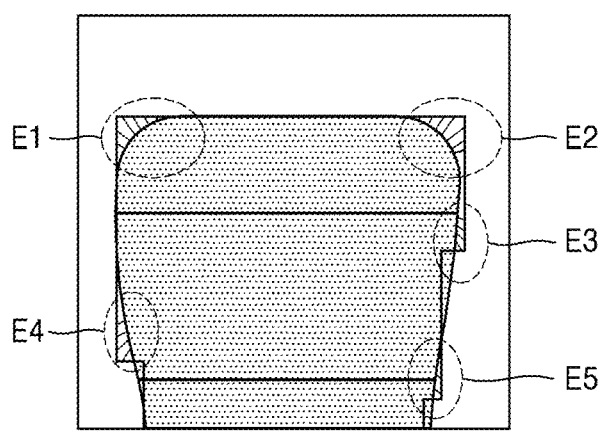

FIGS. 4A and 4B are conceptual diagrams for describing critical dimension (CD) measurement and contour measurement.

Referring to FIG. 4A, the CD measurement may be one-dimensional measurement with respect to a width of a pattern, and the measurement may be performed only in regions having both flat side surfaces. In addition, the measurement may be performed in a manner of averaging a CD with respect to a region of interest (ROI). As illustrated in FIG. 4A, it may difficult to perform the CD measurement on edges, and accordingly, the edges may not be searched for as a weak point even when the edges are severely deformed. For example, when at each of the edges of FIG. 4A, a difference between a reference CD and a measured CD is about −1.2 nm or less, and a determination range of one-dimensional error is set to about ±1.5 nm, it may be determined that an abnormality does not exist. Therefore, the CD measurement may be performed only with respect to known locations of a mask pattern element. Thus, simulation and MPC verification of the CD measurement may only be performed at predetermined location(s) corresponding to predetermined EP of the MTO shape.

Referring to FIG. 4B, the contour measurement may be 2D measurement with respect to a shape of the pattern element, and measurement may be performed on any points. The contour measurement may be performed through the EPE measurement described above. As illustrated in FIG. 4B, the contour measurement and comparisons described herein may be performed on the edges. Problematic edges may include edges of the mask pattern elements at extremities of the mask pattern element and at locations where adjacent edges of the MTO shape meet at angles and/or where edge direction (from a top down view) changes direction (such as having a radius of curvature lower than a predetermined value). Accordingly, the problematic edges may be easily searched for as the weak point even when the edge are severely deformed. For example, since EPE values are about 5 nm or more at edges E1 to E5 in FIG. 4B, when a determination range of a 2D error is set to about ±2.5 nm, edges E1 to E5 may be easily determined as the weak point. Therefore, the contour measurement and comparisons described herein may be formed at a finer level where the contour measurement and comparisons are performed on a denser collection of edge points EP at the problematic edges as compared contour measurement and comparisons with respect to other edges of the mask pattern element (which may include not contour measurement and comparisons for certain portions of the mask pattern element).

In addition, the MPC verifying method according to the present exemplary embodiment may use the CD measurement and the contour measurement together. Furthermore, only the contour measurement may be used in some cases. The contour measurement may be, for example, the EPE measurement.

Figure 5:
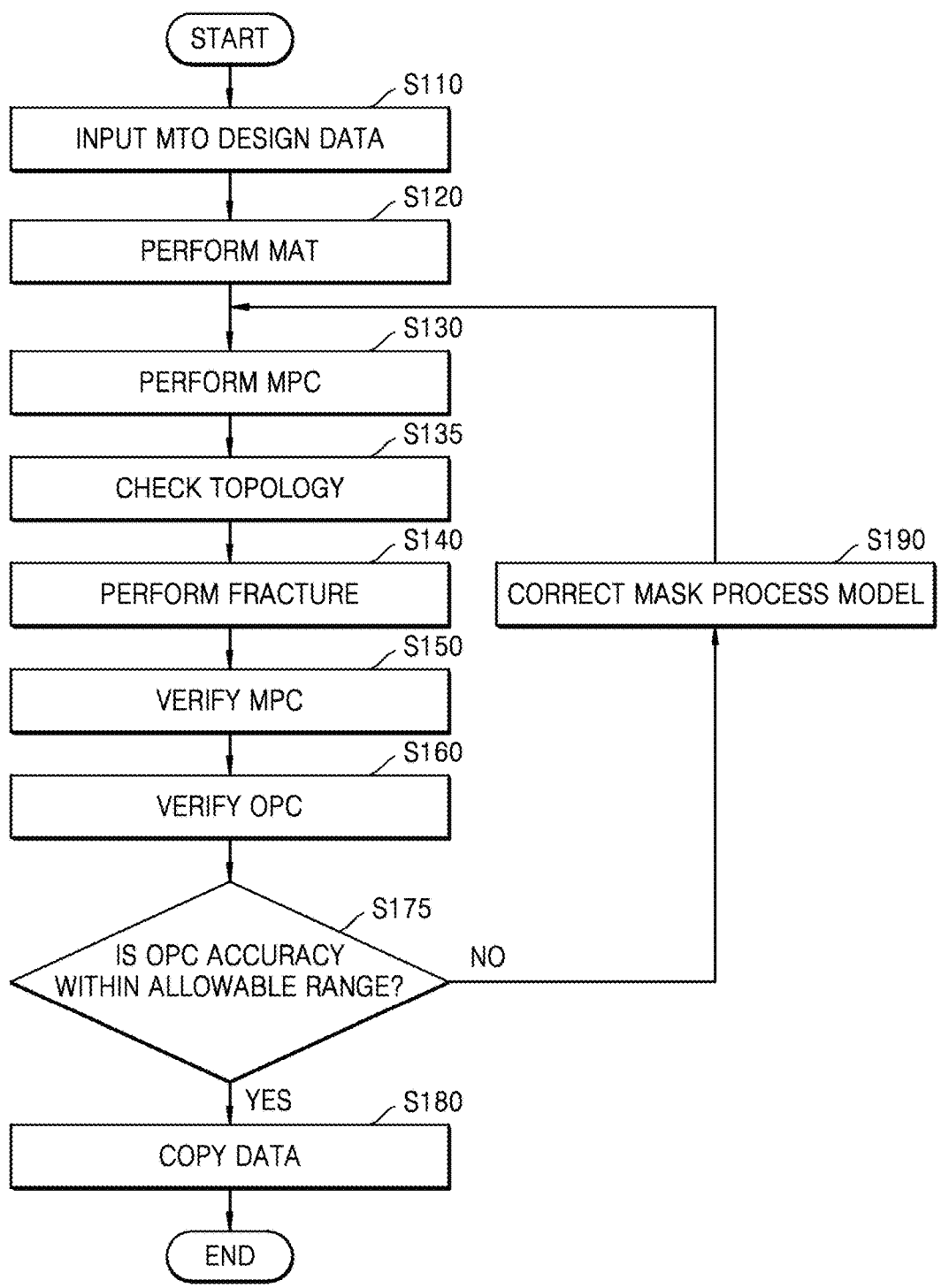
FIG. 5 is a flowchart of an MPC verifying method according to an exemplary embodiment.

FIG. 5 is a flowchart of an MPC verifying method according to another exemplary embodiment of the inventive concept. The description provided in FIG. 1 will be simplified or omitted for convenience in description.

Referring to FIG. 5, in the MPC verifying method according to the present exemplary embodiment, MTO design data is received (S110). The receiving of the MTO design data may be the same as described with reference to FIG. 1. Mean-to-target (MTT) auto targeting (MAT) may be performed on the MTO design data (S120). The MAT may mean that a MTT is automatically performed. The MTT may mean a process of evaluating that a measured value reaches a certain degree of a target value.

After the MAT is performed, an MPC may be performed (S130). The performing of the MPC may be performed as described above and a redundant description thereof is therefore omitted.

After the MPC is performed, a topology check may be performed (S135). The topology check may mean a process of checking a phase effect of a mask.

After the topology check is performed, a fracture may be performed (S140). The fracture may mean a fracturing the mask process corrected data for each region and converting a format of the fractured mask process corrected data into a format for an electron beam exposure apparatus. The fracture may include, for example, a data manipulation such as scaling, sizing of data, rotating of data, pattern reflection, or a color inversion.

During a conversion of data through the fracture, data about systematic errors may be corrected, the systematic errors occurring at the time of transferring design data to an image on a wafer. Therefore, the fracture may function to supplement a function of the MPC. In some cases, the fracture may be performed before the MPC is performed.

After the fracture is performed, an MPC verification may be performed (S150). The MPC verification may be as described above and performed by outputting a mask pattern in a 2D contour shape obtained through a simulation using a mask process model and comparing a 2D contour with a MTO shape obtained from the MTO design data.

After the MPC verification is performed, an optical proximity correction (OPC) verification may be performed (S160).

The OPC verification may include verifying OPC accuracy by inputting data of the mask process corrected data corresponding to locations in which the OPC is performed (e.g., the OPC mask patterns and/or neighbouring mask pattern element which are intended to affected by OPC masks pattern elements), in a lithography simulation tool (e.g., simulation computer) or an OPC verification tool (e.g., simulation computer). The OPC verification may be performed by performing an optical rule check (ORC) after a lithography simulation is performed. The ORC may include verifying via a model-based OPC and may include checking a mask process, a lithography process, a photoresist process, or an etching process as part of the process of verifying the model-based OPC.

When an error extracted through the ORC deviates from an allowable range, an OPC model may be corrected, and the OPC verification may be re-performed. The correcting of the OPC model may include adjusting overall parameters such as an OPC recipe, a model calibration, and a horizontal and vertical bias adjustment to correct a program such that a desired OPC process model is adjusted (which may be used during subsequent manufacturing of the lithography mask and/or semiconductor device patterned by the mask) is output. The correcting of an OPC model may also include correcting a shape or location of OPC patterns if desired.

In the MPC verifying method according to the present exemplary embodiment, after the MPC verification is performed, the OPC verification may be separately re-performed regardless of the OPC. In the OPC verification, data about the 2D contour of the mask pattern (or a region of the mask pattern) acquired through the simulation may be used as input data to the lithography simulation tool. In the MPC verifying method according to the present exemplary embodiment, as in the OPC, the OPC verification may be performed through the ORC by inputting the data about the 2D contour into the lithography simulation tool as the input data. The OPC verification may comprise simulating the forming of a pattern on a wafer in the production of a semiconductor device and comparing the formed pattern with a target pattern. The OPC verification may contribute to a more accurate MPC verification. In addition, even though simulated, since the OPC related pattern is formed on the wafer, the OPC verification may be referred to as a verification at a wafer level.

In the MPC verifying method according to the present exemplary embodiment, the OPC verification may be a compact OPC verification of performing the ORC only on factors related to OPC pattern elements formed on a mask. For example, the checking of the lithography process, the photoresist process, or the etching process which is irrelevant to the mask, may be excluded from the ORC. As described above, a time of the OPC verification may be reduced by performing the compact OPC verification.

After the OPC verification is performed, it may be determined whether the OPC is within an allowable range (S175), and when the OPC deviates from the allowable range (NO), the mask process model may be corrected (S190). The correcting of the mask process model is substantially the same as described with reference to FIG. 1. For example, it may be determined based on the above-described ORC whether the OPC is within the allowable range.

When the OPC is within the allowable range (YES), data may be copied (S180). The copying of the data may mean that data, in which the MPC is performed, is stored or transferred as valid data and used to manufacture a mask later and used to manufacture semiconductor devices using the subsequently manufactured mask. The copied data may include the mask process corrected data and the mask process model, both of which may be used in the manufacture of the mask. The OPC within the allowable range may mean that the MPC is accurate, and accordingly, it may be unnecessary to separately determine MPC accuracy.

In the MPC verification method according to the present exemplary embodiment, the MPC accuracy may be more accurately determined by performing the MPC verification together with the OPC verification.

Figure 6:
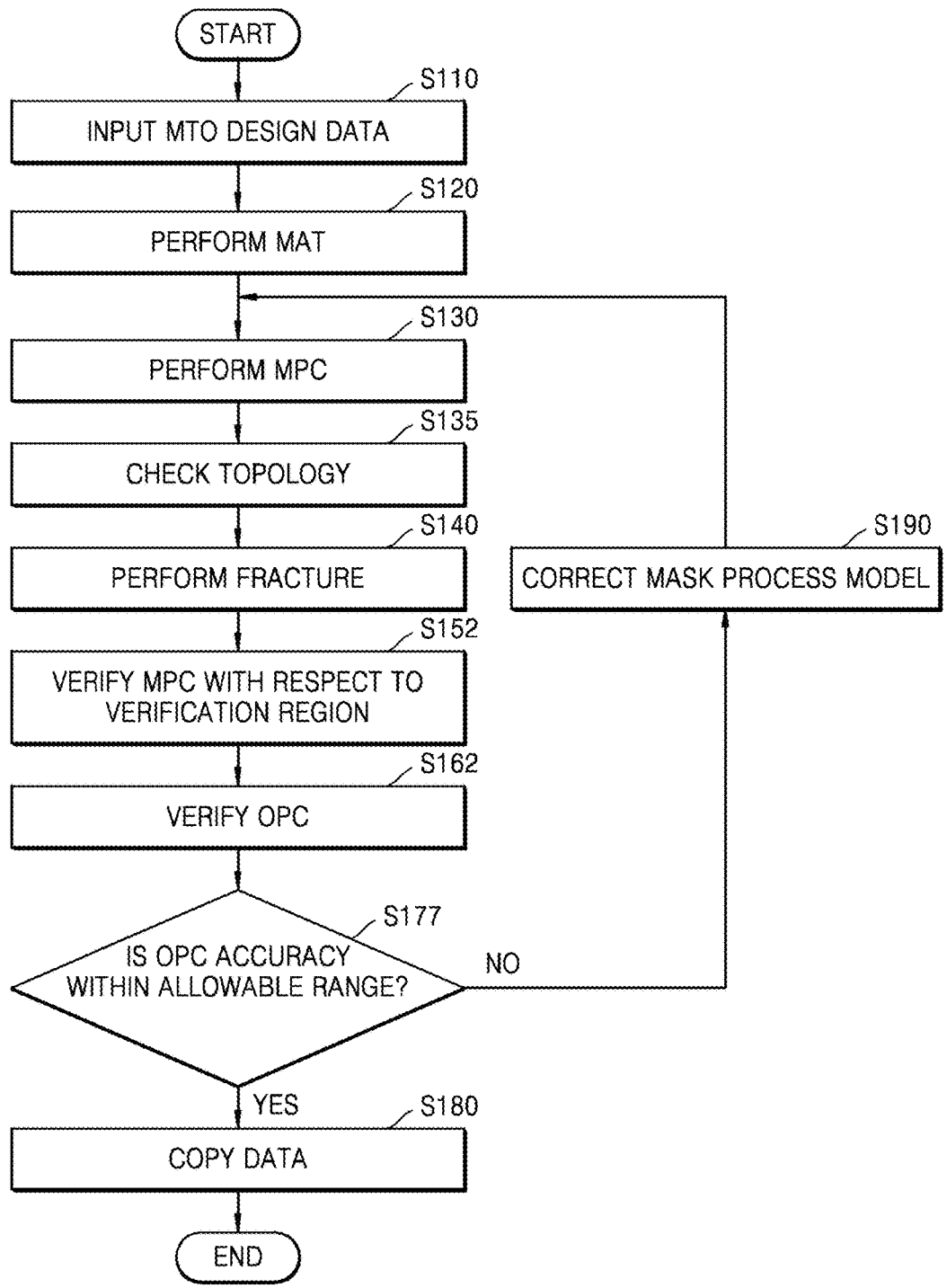
FIG. 6 is a flowchart of an MPC verifying method according to an exemplary embodiment.

FIG. 6 is a flowchart of an MPC verifying method according to another exemplary embodiment of the inventive concept. The description provided in FIGS. 1 and 5 will be simplified or omitted for convenience in description.

Referring to FIG. 6, operation S110 of receiving MTO design data to operation S140 of performing a fracture are substantially the same as described with reference to FIGS. 1 and 5.

After the fracture is performed, an MPC verification may be performed on verification regions (S152). When the verification regions are not preset, and a verification is performed on all of regions, an excessive time is consumed to calculate an error amount, resulting in increasing a turn around time (TAT) of a mask manufacturing process due to an increase in MPC verification time. Therefore, the time required for the MPC verification may be significantly decreased by setting appropriated verification regions and calculating the error amount only with respect to the set verification regions. For example, hot-spot regions having a weak patterning margin, corners of patterns, or regions in which an error frequently occurs may be set as the verification regions. In addition, regions may be categorized according to the EPE values described above, and points having a possibility of issue occurrence may be predicted to set relevant points as verification regions. When the verification regions are set, the MPC verification may be performed by extracting a 2D contour only with respect to pattern elements within the set verification regions.

After the MPC verification is performed, an OPC verification may be performed (S162). As described with respect to FIG. 5 above, the OPC verification may be a compact OPC verification of checking only factors related to a mask. In addition, in the MPC verifying method according to the present exemplary embodiment, an amount of data about the 2D contour input in a lithography simulation tool for the OPC verification may be less compared to the OPC verification of FIG. 5. More specifically, in the MPC verifying method according to the present exemplary embodiment, the 2D contour may be extracted only with respect to the regions set in the MPC verification. Therefore, data to be input in the lithography simulation tool for the OPC verification may be data about the 2D contour data extracted only with respect to the verification regions rather than data about the 2D contour with respect to all of regions. As a result, in the MPC verifying method according to the present exemplary embodiment, since a compact OPC verification and an OPC verification only with respect to the verification regions are performed, the OPC verification may be more rapidly performed.

It may be determined whether the OPC is within an allowable range (S177), when the OPC is within the allowable range (YES), operation S180 of copying data may be performed, and when the OPC deviates from the allowable range (NO), operation S190 of correcting the MPC model may be performed as described above.

Figure 7:
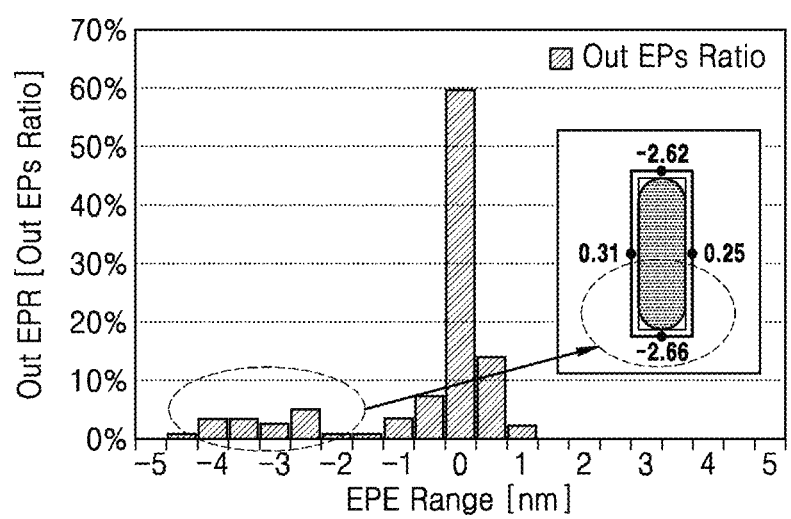
FIG. 7 is a graph for describing a principle of outputting a 2D contour only in a specific region through an EPE quantification.

FIG. 7 is a graph showing a principle of outputting a 2D contour only in a specific region through quantifying an edge placement error (EPE).

Referring to FIG. 7, a concept of an Out EPs ratio (Out EPR) may be introduced to quantify the EPE. The Out EPR may be defined by Formula (1) below.

Out EPR=[EPE Spec Out EPs/all EPs]*100(%)    Formula (1)

The EPs may be evaluation points in which an EPE is calculated and may be preset, as described herein. For example, in FIG. 7, black points on a picture of a right pattern may be the EPs. The EPE Spec Out EPs may be specific EPs which fall outside of a specified range (EPE Spec) of an acceptable EPE value. The EPE Spec may be a reference EPE range indicating an acceptable EPE and relates to the computational complexity in the MPC verification. For example, when the reference EPE range of the EPE Spec is narrow, the error computational complexity may increase, and when the reference EPE range of the EPE Spec is wide, the error computational complexity may decrease. For reference, in the picture of the right pattern, an outermost rectangular portion may be an MTO shape obtained by MTO design data, a middle rectangular portion may be a shape represented by mask process corrected data obtained by performing an MPC on the MTO design data, and an inner portion, which is hatched in an oval shape, may correspond to a 2D contour SC.

Regarding the Out EPR, when the reference EPE range is set to about [−0.5 nm, 0.5 nm] (that is, a reference EPE range indicating that an acceptable calculated EPE should have a magnitude less than 0.5 nm), as illustrated in FIG. 7, most EPE values of the EPs may be concentrated in the range of about −1 nm to about +1 nm, and thus, it may be seen that the Out EPR is very high. The high Out EPR may mean that there are a lot of points having relevant EPE values requiring calculations. In addition, when a determination reference of MPC accuracy is about ±1.5 nm, the EPs in the range of about −1 nm to +1 nm may be points in which the MPC is accurately performed and may not need the MPC verification, and accordingly, it may not be necessary to extract the 2D contour. Therefore, when the reference EPE range is set to about [−0.5 nm, 0.5 nm], an excessive time may be unnecessarily consumed to perform the MPC verification.

In a case of EPs deviating from the reference EPE range like portions in a dotted circle at lower left on a graph of FIG. 7, the Out EPR may be low. For example, in the picture of the right pattern in FIG. 7, EPs in the dashed circle may be points in which the number of the EPs is relatively small with respect to mask pattern elements where MPC is inaccurately performed. Therefore, when the reference EPE range is set to about [−2 nm, 2 nm] (a reference EPE range indicating that an acceptable calculated EPE should have a magnitude less than 2 nm), the Out EPR may be a lower percentage and reflect a lower percentage of EPs in which the MPC is inaccurately performed. In addition, the 2D contour may be extracted only with respect to the EPE Spec Out EPs for the associated the MPC verification described herein, thereby considerably reducing an MPC verification time.

As described above, the comparison between the MTO design data and the 2D contour SC may be quantified by introducing the Out EPR concept, and a weak pattern may be categorized by calculating the error amount of the relevant portions. In the picture of the pattern in FIG. 7, the EPs or evaluation points are one mere example. Therefore, the EPs may be variously set according to characteristics of a pattern and the number of the EPs may be increased or decreased according to characteristics of a pattern. As the number of the EPs is increased, an MPC verification time may be increased, and accordingly, a turn around time (TAT) may be increased.

Figure 8:
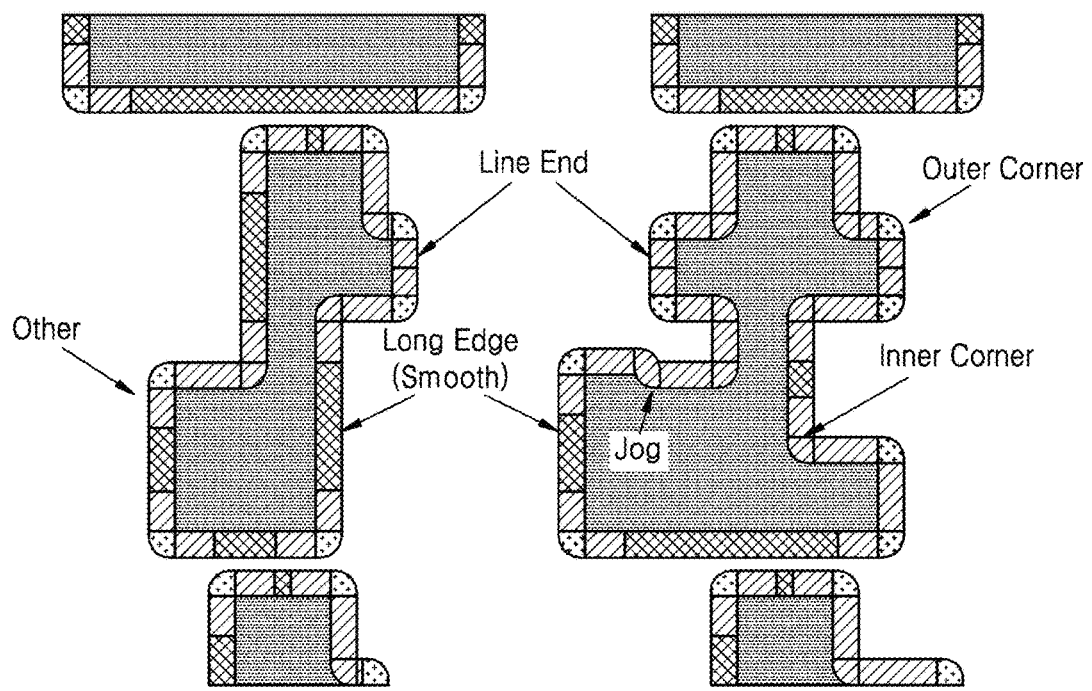
FIG. 8 is a conceptual diagram of pattern regions for describing patterns to be verified in the MPC verifying method of FIG. 6.

FIG. 8 is a conceptual diagram of pattern regions for describing patterns to be verified in the MPC verifying method of FIG. 6.

Referring to FIG. 8, as described above, the MPC verification may be performed only on patterns and/or regions in which an error frequently occurs, taking into consideration the verification time and the TAT. Therefore, it may be necessary to previously define patterns and/or regions to be verified.

For example, hot-spot regions, in which a patterning margin is weak, may be set to regions that need to be verified. In patterns illustrated in FIG. 8, a setting may targeted at corners of the patterns that is, outer corner rounding. Of course, portions such as a line end, an inner corner, and a jog may not be fully excluded from targeting. As described above, regions may be categorized according to EPE values described above, and the points having a high possibility of issue occurrence may be predicted to set relevant points as the verification regions.

As patterns and/or regions needing the verification are set, the number of evaluation points may be changed, and a weight of relevant points may be changed. In addition, as the number and/or the weight of the evaluation points are changed, a time and a result of an error calculation may be changed in the MPC verification. Furthermore, when even an optical proximity correction (OPC) verification is performed, a compact OPC of extracting and checking factors related to a mask may be performed, and the compact OPC may also be performed only with respect to the patterns and/or the regions needing the verification, thereby reducing a time of the OPC verification.

Figure 9:
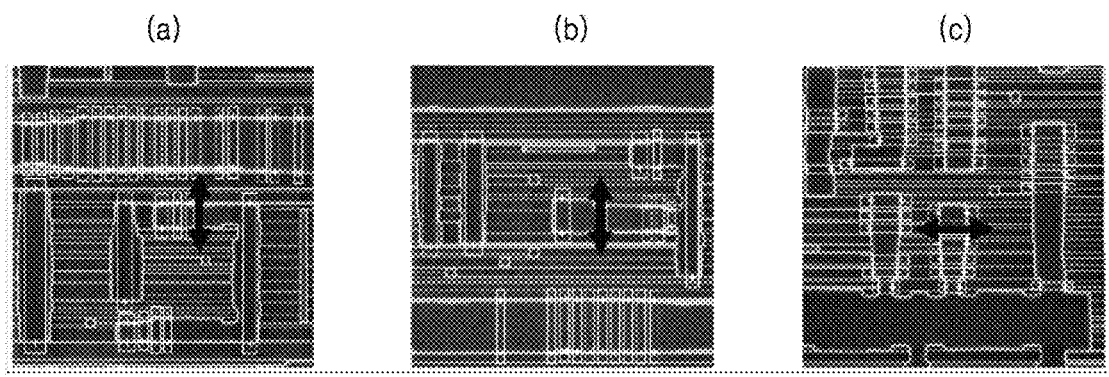
FIG. 9 is a pattern layout for describing consistency of MPC verification through comparison of CD measurement values between an MTO design target, a scanning electron microscope (SEM) contour, and 2D contours, according to an exemplary embodiment of the inventive concept.

FIG. 9 is a pattern layout for describing consistency of an MPC verification through comparison of CD measurement values between an MTO design target reflected by the MTO design data, a scanning electron microscope (SEM) contour, and 2D contours SC, according to an exemplary embodiment of the inventive concept.

Referring to FIG. 9, assuming that patterns including hot-spot 1, hot-spot 2, and hot-spot 3 are respectively illustrated in (a), (b), and (c) of FIG. 9, the CD measurement values of black arrow portions in the MTO design target, the SEM contour and the 2D contours SC may be shown in Table 1, and a unit of each of numerical values may be nanometer (nm).

TABLE 1

|  | Hot-spot 1 | Hot-spot 2 | Hot-spot 3 |
| --- | --- | --- | --- |
| MTO Design Target | 240.4 | 254 | 264.8 |
| SEM Contour(Ref.) | −0.4 | 1.4 | 2.7 |
| Bias 2D Contour | 1.2 (+1.6) | 2.5 (+1.1) | 0.9 (−1.8) |
| Model 2D Contour | 1.7 (+2.1) | 2.1 (+0.7) | 1.4 (−1.3) |

In Table 1, each of numerical values of the SEM contour and the bias and model 2D contours may indicates a difference from each of numerical value of the MTO design target. The bias 2D contour may mean a contour acquired by performing the MPC using a rule or a bias application, and the model 2D contour may mean a contour acquired by performing the MPC using a model. The SEM Contour may indicate a deviation of a location of the mask pattern element of a manufactured mask (e.g. EP) from the target location of the MTO design target. The SEM Contour value may be determined by measurement via an scanning electron microscope (SEM). When each of numerical values of the SEM contour is set to a reference value (Ref.), each of numerical values in round brackets may indicate a deviation from the reference value (Ref).

As described above, consistency of the MPC verification may be confirmed within an MPC model accuracy level by comparing the CD measurement values of the MTO design target, the SEM contour, and the 2D contours. As can be confirmed from Table 1, since MPC model accuracy is set to about ±2.5 with respect to a 2D pattern, and all of numerical values in round brackets are within about ±2.5 with respect to the numerical values of the SEM contour, the consistency of the MPC verification may be confirmed within the MPC model accuracy level.

Figure 10:
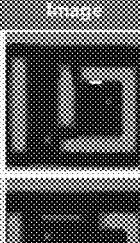
FIG. 10 shows photographs for describing consistency of MPC verification through comparison between a lithography simulation on hot-spot regions of FIG. 9 with a CD of a lithography result by an actual mask.

FIG. 10 shows photographs for describing consistency of an MPC verification through comparison between a CD of a lithography simulation on hot-spot regions of FIG. 9 and a CD of a lithography result by an actual mask. Hot spot columns 1, 2, and 3 may correspond to hot-spot 1, hot-spot 2, and hot-spot 3 of FIG. 9, respectively.

Referring to FIG. 10, A may indicate images of a hot-spot 1 region, a hot-spot 2 region, and a hot-spot 3 region acquired through the lithography simulation using the MTO design data, and CDs corresponding to arrows may respectively be about 41.7, about 42.9, and about 44.4. B may indicate images of in the hot-spot 1 region, the hot-spot 2 region, and the hot-spot 3 region acquired through the lithography simulation using the 2D contour, and CDs corresponding to arrows may respectively be about 41, about 41, and about 44. C may indicate images of in hot-spot 1 region, the hot-spot 2 region, and the hot-spot 3 region acquired through a reduction exposure system simulation with respect to a mask, and CDs corresponding to arrows may respectively be about 40.8, about 42.2, and about 45.0. D may indicate after develop inspection (ADI) images of the hot-spot 1 region, the hot-spot 2 region, and the hot-spot 3 region acquired through an actual lithography process with respect to the mask, and CDs corresponding to arrows may respectively be about 40.7, about 40.9, and about 42.9.

All of CD differences between the images of A, B, C, and D may indicate an insignificant difference level, for example, the range of about ±1.5 in all of hot-spot 1, hot-spot 2, all hot-spot 3. Therefore, the consistency of the MPC verification may be confirmed even through comparing at a wafer level.

FIGS. 11 to 13 are flowcharts of mask manufacturing methods according to exemplary embodiments of the inventive concept. The description provided in FIGS. 1, 5, and 6 will be simplified or omitted for convenience in description.

Referring to FIG. 11, operation S110 of receiving mask tape-out (MTO) design data to operation S170 of determining whether mask process correction (MPC) accuracy is within an allowable range and operation S190 of correcting a mask process model are substantially the same as described with reference to FIG. 1.

In operation S170 of determining whether the MPC accuracy is within the allowable range, when the MPC accuracy is within the allowable range (YES), pixel data may be generated based on the mask process corrected data resulting from performing MPC (S210). The pixel data may be data directly used in an actual exposure process and may include data about a shape to be exposed and data about a dose allotted to each pixel data. The data about the shape may be bit-map data into which shape data, that is, vector data is converted through a rasterization. The pixel data may also be based on the mask process model that may have been adjusted during MPC.

As described with reference to FIG. 5, the data, in which the MPC is performed, may be stored in a storage unit through operation S180 of copying data and then may be used to generate the pixel data. In addition, the pixel data may also be stored in the storage unit through copying the data.

After the pixel data is generated, an exposure process, that is, an electron beam writing may be performed (S230). The electron beam writing may mean that an electron beam is irradiated on a mask substrate, that is, a mask plate or mask blank based on the pixel data. The mask plate or mask blank may have a structure in which an opaque thin film such as chromium is coated on a transparent base layer such as glass or fused silica. Before the exposure process is performed, a resist film having a strong etch resistance may be coated on the chromium, and in the electron beam writing, the electron beam may be irradiated on a resist film in a predetermined pattern based on the pixel data.

The electron beam writing may be performed through a variable shape beam (VSB) exposure process and a gray exposure process using a multi-beam mask writer (MBMW). Of course, the electron beam writing is not limited to the VSB exposure process and the gray exposure process using the MBMW.

After the electron beam writing is performed, a mask may be formed (S250) by performing a series of processes. The series of processes may include, for example, a development process, an etching process, and a washing process.

In the development process, the resist film on the mask plate may sensitively or insensitively react with a chemical developer depending on whether the resist film had been written by (exposed to) the electron beam during performance of the electron beam writing. In the development process, when an exposed portion of the resist film is removed, the development process may be referred to as a positive treatment, and when only the exposed portion remains (and unexposed portions are removed), the development process may be referred to as a negative treatment.

After the development process is completed, in the etching process, surfaces of the mask, which are not covered with the resist film, may be exposed to a chemical agent for etching, that is, an etchant. The resist film may include a material so as to withstand the etching process, and accordingly, may be less sensitive to the etchant to protect the chromium thereunder while the chromium exposed by the resist film is removed. The etching process may be performed by using a liquid (wet) or plasma (dry) chemical agent. After the exposed portion of the chromium is removed through the etching process, all of resists remaining on the mask may be removed. The washing process may be performed.

The series of processes of forming the mask may include a measurement process or a process of inspecting or repairing defects. In addition, the series of processes may include a process of applying a pellicle. The process of applying the pellicle may mean a process of attaching the pellicle to a surface of the mask for protecting the mask from succeeding contamination during a delivery and a useful life of the mask when it is determined that contamination particles or chemical spots do not exist through final washing or inspecting.

The mask manufacturing method according to the present exemplary embodiment may include an MPC verifying method of extracting a 2D contour using a mask process model and verifying MPC accuracy through the 2D contour. Therefore, in the mask manufacturing method according to the present exemplary embodiment, the process of manufacturing the mask may be improved due to the MPC verifying method, and a more accurate mask may be implemented due to the improved process of manufacturing the mask.

The method of FIG. 11 may also comprise manufacturing a semiconductor device using the mask. After manufacturing the mask, the mask may be used in a photolithography process for patterning a target layer of a wafer. Specifically, a target layer may be deposited on a semiconductor substrate, such as a silicon substrate. A photoresist layer may be deposited on the target layer. The photoresist may be selectively exposed to light via photolithography process using the mask. The photolithography process may irradiating the mask with radiation and so that light is selectively transmitted light to the photoresist on the wafer corresponding to the mask pattern. The photoresist may then be etched in a positive or negative development process so that the mask pattern is transmitted to the photoresist pattern. The photoresist pattern may be used to etch the target layer on the wafer and thus the mask pattern may be transmitted to the target layer. The target layer may be the semiconductor substrate. The target layer may be a hard mask layer that is subsequently used to etch a layer below the mask layer. The target layer may be an insulator (an silicon oxide or nitride). Patterned openings formed in the insulator may be filled with a conductor (via metal or doped semiconductor deposition and CMP, via epitaxial growth of a semiconductor material, etc.) As described herein, OPC pattern elements of the mask, which may be subject to the MPC described herein, may not be have a separate corresponding pattern element in the photoresist, and target layer of the wafer but instead influence the development of neighbouring pattern elements in the photoresist.

Referring to FIG. 12, operation S110 of receiving MTO design data to operation S180 of copying data and operation S190 of correcting a mask process model are substantially the same as described with reference to FIG. 5. Operation S210 of generating pixel data, operation S230 of performing an electron beam writing, and operation S250 of forming a mask may be performed to manufacture the mask. Operation S210 of generating the pixel data, operation S230 of performing an electron beam writing, and operation S250 of forming the mask are substantially the same as described with reference to FIG. 11.

Referring to FIG. 13, operation S110 of receiving MTO design data to operation S180 of copying data and operation S190 of correcting a mask process model are substantially the same as described with reference to FIG. 6. Operation S210 of generating pixel data, operation S230 of performing an electron beam writing, and operation S250 of forming a mask may be performed to manufacture the mask. Operation S210 of generating the pixel data, operation S230 of performing the electron beam writing, and operation S250 of forming the mask are substantially the same as described with reference to FIG. 11.

While the inventive concept has been described with reference to exemplary embodiments, it will be apparent to those of ordinary skill in the art that various changes and modifications may be made without departing from the spirit and scope of the inventive concept. Therefore, the scope of the invention is to be determined by the broadest permissible interpretation of the following claims and their equivalents, and shall not be restricted or limited by the foregoing description.

What is claimed is:

1. A manufacturing method comprising:
    performing a mask process correction (MPC) on mask tape-out (MTO) design data describing a first mask pattern by applying the MPC to the MTO design data to obtain mask process corrected data describing a second mask pattern;
    verifying the performance of the MPC by generating a two-dimensional (2D) contour of one or more mask pattern elements of a photolithography mask by performing a simulation of manufacturing the one or more mask pattern elements of the photolithography mask described by the mask process corrected data using a mask process model that models a photolithography mask manufacturing process; and
    manufacturing at least one of a mask and a semiconductor device in response to the verifying,
    wherein the MPC is responsive to the mask process model and the mask process model is adjustable based on the verifying, and
    wherein verifying the MPC comprises comparing the 2D contour with a shape of one or more mask patterns with corresponding one or more mask patterns represented by the MTO design data.

2. The manufacturing method of claim 1, wherein the generating of the 2D contour comprises applying a simulation transformation function to the mask process corrected data.

3. The manufacturing method of claim 1, wherein the manufacturing of at least one of a mask and a semiconductor device includes manufacturing a photolithography mask with process parameters described by the mask process model.

4. The manufacturing method of claim 1, wherein an error amount is obtained through the comparing, the error amount comprising at least one of an edge placement error (EPE) and a critical dimension (CD).

5. The manufacturing method of claim 1, wherein generating the 2D contour of the one or more mask pattern elements comprises performing the simulation of manufacturing the one or more mask pattern elements described by the mask process corrected data only with respect to a specific region of the second mask pattern.

6. The manufacturing method of claim 1, further comprising, after verifying the MPC, verifying at a wafer level by inputting data about the 2D contour into an optical proximity correction (OPC) verification tool.

7. The manufacturing method of claim 6, wherein the 2D contour is output only with respect to a specific region of the second mask pattern for a plurality of pattern elements regularly distributed across the second mask pattern, and verifying at the wafer level comprises performing the verification at the wafer level only on the specific region.

8. The manufacturing method of claim 6, further comprising:
    determining that the OPC deviates from an allowable range;
    in response to determining the OPC deviates from the allowable range, re-performing the MPC to obtain modified mask process corrected data;
    verifying that the OPC is within the allowable range based on the re-performed MPC; and
    using the modified mask process corrected data to manufacture a mask.

9. The manufacturing method of claim 6, further comprising performing a topology check and a fracture before performing the verification on the MPC.

10. The manufacturing method of claim 1, wherein the mask process correction performs a transformation of the MTO design data to obtain the mask process corrected data based upon the mask process model.

11. A manufacturing method comprising:
performing a mask process correction (MPC) on mask tape-out (MTO) design data describing a first mask pattern by applying the MPC to the MTO design data to obtain mask process corrected data describing a second mask pattern;
verifying the performance of the MPC by generating a two-dimensional (2D) contour of one or more mask pattern elements by performing a simulation of manufacturing corresponding one or more mask pattern elements described by the mask process corrected data using a mask process model;
manufacturing at least one of a mask and a semiconductor device in response to the verifying, including
generating pixel data based on the mask process corrected data;
performing electron beam writing on a mask blank based on the pixel data; and
forming the mask by performing a development process and an etching process on a mask substrate,
wherein the MPC is responsive to the mask process model and the mask process model is adjustable based on the verifying.

12. The manufacturing method of claim 11, wherein verifying the performance of the MPC comprises:
comparing the 2D contour with a shape described by the MTO design data.

13. The manufacturing method of claim 12, wherein an error amount is obtained through the comparing, the error amount comprising at least one of an edge placement error (EPE) and a critical dimension (CD), and the simulation is performed only with respect to a specific portion of the second mask pattern.

14. The manufacturing method of claim 11, further comprising performing verification at a wafer level by inputting data about the 2D contour into an optical proximity correction (OPC) verification tool after verifying the performance of the MPC.

15. The manufacturing method of claim 14, further comprising:
determining that the OPC is within an allowable range; and
using the mask process corrected data to manufacture at least one of a mask and a semiconductor device.

16. A manufacturing method comprising:
performing a mask process correction (MPC) on mask tape-out (MTO) design data describing a first mask pattern by applying the MPC to the MTO design data to obtain mask process corrected data describing a second mask pattern;
verifying the performance of the MPC by generating a two-dimensional (2D) contour of one or more mask pattern elements by performing a simulation of manufacturing corresponding one or more mask pattern elements described by the mask process corrected data using a mask process model;
manufacturing at least one of a mask and a semiconductor device in response to the verifying, including
wherein the mask tape-out (MTO) design data describes the first mask pattern having a plurality of first mask pattern elements;
wherein performing the MPC comprises obtaining the mask process corrected data by applying the mask process correction to the MTO design data, the mask process corrected data representing a second mask pattern having a plurality of second mask pattern elements, each of the second mask pattern elements corresponding to a respective one of first mask pattern elements, at least some of the second mask pattern elements having a different size than the corresponding first mask pattern element;
wherein verifying the performance of the MPC comprises:
using the mask process model, simulating a manufacture of one or more of the second mask pattern elements to obtain first contours respectively corresponding to the one or more second mask pattern elements;
determining a plurality of first deviation values, by, for each first contour, comparing the first contour to a corresponding first mask pattern element, to obtain a first deviation value for each first contour;
based on the plurality of first deviation values, determining that the mask process correction is insufficient;
adjusting the mask process model;
adjusting the mask process correction based on the adjusted mask process model;
using the adjusted mask process correction, modifying the MTO design data to obtain modified mask process corrected data representing a third mask pattern having a plurality of third mask pattern elements, each of the third mask pattern elements corresponding to a respective one of the first mask pattern elements, at least some of the third mask pattern elements having a different size than the corresponding first mask pattern element;
using the adjusted mask process model, simulating a manufacture of one or more of the third mask pattern elements to obtain corresponding second contours respectively corresponding to the one or more third mask pattern elements;
determining a plurality of second deviation values, by, for each second contour, comparing the second contour to a corresponding first mask pattern element, to obtain a second deviation value for each second contour; and
based on the plurality of second deviation values, determining that the mask process correction is sufficient, and
wherein the manufacturing of at least one of a mask and a semiconductor device uses the modified mask process corrected data.

17. The method of claim 16, wherein determining the plurality of first deviation values comprises, for each first contour, determining deviations of locations of points of edges of the first contour with locations of corresponding points of edges of the corresponding first mask pattern element.

18. The method of claim 17, wherein determining deviations of locations comprises determining deviations with respect to locations of first points of first edges of the first contour located at one or more of extremities of the first contour, corners of the first contour and edges having a radius of curvature below a predetermined value, and with respect to second points of second edges of the first contour, wherein the second points are spaced apart from each other further than the first points are spaced apart from each other.

19. The method of claim 16, wherein the manufacturing of at least one of a mask and a semiconductor device is performed with process parameters described by the adjusted mask process model.

20. The method of claim 16, further comprising verifying an optical proximity correction mask element by simulating a photolithography process using the first contours.

* * * * *